United States Patent [19]

Tems

[11] 3,892,312

[45] July 1, 1975

[54] INTEGRATED CIRCUIT CARRIER

[75] Inventor: Adam Tems, Philadelphia, Pa.

[73] Assignee: Milross Controls, Inc., Southampton, Pa.

[22] Filed: June 11, 1973

[21] Appl. No.: 368,749

[52] U.S. Cl. ............ 206/328; 339/17 CF; 339/19 R

[51] Int. Cl. ...................... B65d 85/00; H01n 13/54

[58] Field of Search .................... 206/328, 330, 329; 339/17 CF, 19 R

[56] References Cited

UNITED STATES PATENTS

| | | | |
|---|---|---|---|
| 3,604,557 | 9/1971 | Cedrone | 206/329 |
| 3,652,974 | 3/1972 | Tems | 206/328 |
| 3,653,498 | 4/1972 | Kisor | 206/329 |
| 3,673,543 | 6/1972 | Garner | 206/328 |
| 3,784,960 | 1/1974 | Bruckner | 339/17 CF |
| 3,820,054 | 6/1974 | Clewes et al. | 339/17 CF |

*Primary Examiner*—William I. Price
*Assistant Examiner*—Joseph Man Fu Moy
*Attorney, Agent, or Firm*—Edelson and Udell

[57] ABSTRACT

A one-piece molded plastic carrier for a dual-in-line integrated circuit package or module having an open-ended box-like structure formed internally upon opposite side walls thereof with grooves or channels for receiving predeterminedly selected module leads with minimum pressure or stress imposed thereon, the lead grooves being provided for the purpose of precluding endwise shift of the module in the carrier during insertion and to hold it properly centered therein. The carrier is provided at the bottom end thereof with transversely extending support means for the body of the module and at its opposite ends with resilient retention members operative to quick-releasably hold the module captive in the carrier solely by engagement of the retention members with the body of the module, thereby obviating any dependency upon frictional engagement of the module leads with the carrier for holding the module therein as would tend to develop destructive pressures and stresses on the module by bending forces imposed on the module leads. The carrier is designed to provide full and easy access to the module body and all of its leads through one or both open ends of the carrier for manual or automatic mechanical handling and marking and testing thereof.

14 Claims, 9 Drawing Figures

INTEGRATED CIRCUIT CARRIER

This invention relates generally to carriers for electronic or electrical component modules and more particularly to a carrier for releasably receiving and holding captive therein a packaged integrated circuit assembly of the type commercially known as a "dual-in-line package" having two sets of spaced leads arranged in two parallel rows thereof respectively disposed along opposite sides of an insulating body in which the circuitry is encapsulated.

Integrated circuit packages require to be supported in carriers in order to protect them against damage during handling and testing thereof, especially when the handling, such as is involved in connection with routine temperature and moisture cycling procedures and the mechanized loading, feeding, sorting, marking, classification and various tests, is performed by automatic mechanical handling equipment. In particular, a high degree of care is required to prevent subjecting the leads of the integrated circuit to such pressures and stresses as might cause cracking of the delicate dielectric body of the integrated circuit module with such resultant destruction of the circuit encapsulation seal as would permit deleterious moisture penetration.

Having the foregoing in mind, it is among the principal objects of the present invention to provide a dual-in-line package carrier in which the integrated circuit module may be inserted and held without imposing any such pressure or stresses upon the leads thereof as might damage or completely destroy the operative integrity of the module.

A further specific object is to provide a carrier of the type above mentioned which receives and releasably holds the dual-in-line module securely captive therein by resilient elements which directly engage the dielectric body of the component and so avoid any necessity of depending upon the leads themselves to frictionally retain the module in the carrier as is generally customary with commercially available carriers, thereby enabling the leads to be straight or only slightly angled to minimize subjecting the same to such pressures or stresses as would tend to damage the module upon its insertion into and removal from the carrier.

Still other objects of the invention are to provide a dual-in-line integrated circuit module carrier which will permit easy loading and unloading of the carrier, either manually or mechanically by automatic mechanism, without imposing any damaging stresses on the module and which will permit easy access to the encapsulating body of the integrated circuit as well as to the leads extending therefrom whereby to facilitate testing and performing such other operations upon the module as may be required while the module is retained in the carrier.

Other objects and advantages of the present invention will appear more fully hereinafter, it being understood that the present invention consists in the combination, construction, location and relative arrangement of parts as hereinafter described, as shown in the accompanying drawings and as finally pointed out in the appended claims.

In the accompanying drawings which are illustrative of the present invention and show preferred forms thereof:

In the several figures, like elements are denoted by like reference numerals.

Figure 4:
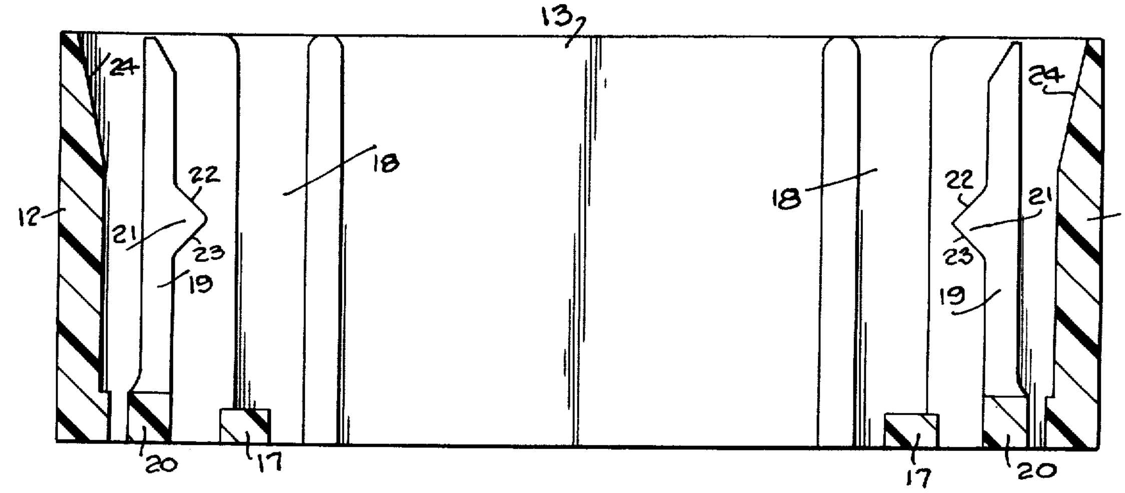
FIG. 4 is a longitudinal vertical sectional view as taken along the line 4—4 of FIG. 2.
Figure 5:
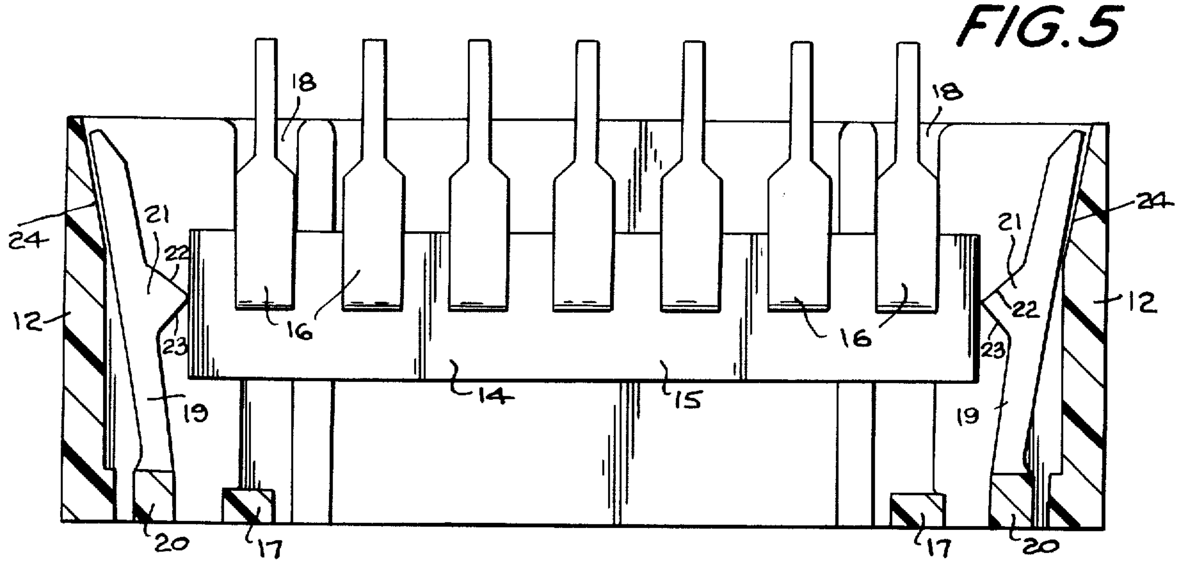
FIG. 5 is a view similar to FIG. 4 showing the integrated circuit module partially inserted into the carrier of the present invention.
Figure 6:
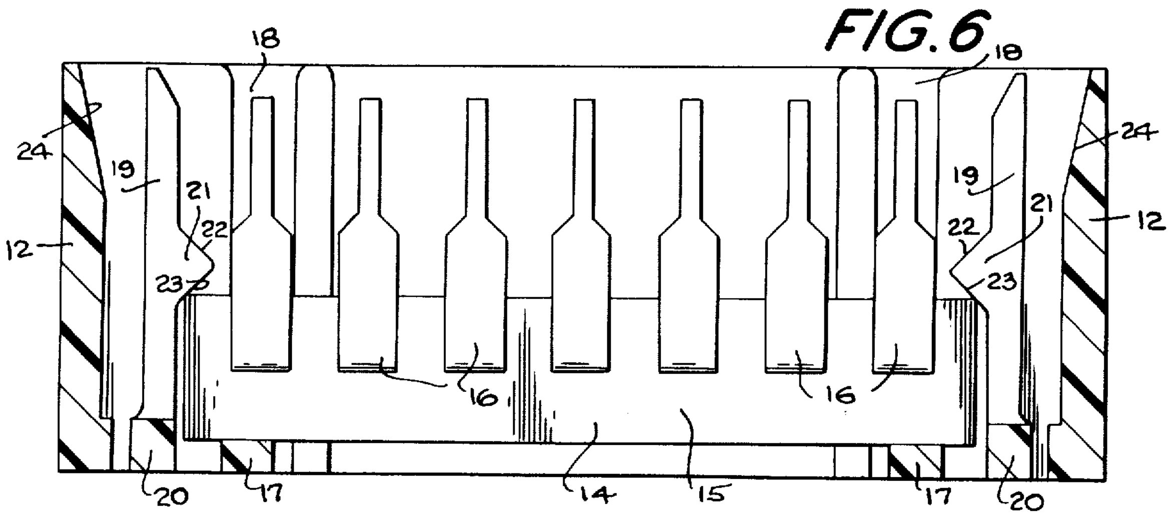
FIG. 6 is an additional view also similar to FIG. 4 showing the integrated circuit module fully seated and held captive in its said carrier.

Referring now more particularly to the drawings, it will be observed that the carrier of the present invention, designated generally by the reference numeral 10 in FIGS. 1 to 6 illustrating one form thereof, is basically in the form of an open-ended rectangular box-like structure having opposite side walls 11—11 interconnected by end walls 12—12 to provide the structure with a top opening 13 through which may be flatwise inserted with it leads extending upwardly an electrical integrated circuit component of the type commercially known as a dual-in-line package, "DIP" or "DIL". For brevity these will all hereinafter be referred to generically as DIP. Such a DIP package, designated 14, is shown in FIGS. 5 and 6. The carrier 10 and all of its parts as hereinafter described is molded as a one-piece structure of any suitable dielectric material, such as polysulfone or other type of thermoplastic or even thermo-setting plastic material.

The design of the DIP package and its particular function is not in itself relevant to the present invention and will not be described in detail except to point out that it consists of a rectangularly-shaped, relatively thin flat body 15 of electrical insulating material in which is encapsulated an integrated circuit (not shown) having leads 16 respectively connected to appropriate elements of the integrated circuit. These leads extend laterally outward and thence downward from the body 15 to provide it with two parallel rows of such leads uniformly spaced along the opposite sides thereof, which leads normally have an outward rake of about 15° to insure their respective frictional engagement in grooves provided therefor in the commercially available DIP carriers for retaining the DIP package within such carriers.

Since the body of the DIP package is generally made of ceramic or other such relatively fragile insulating material, sometimes in the form of a pair of ceramic chips which are laminated to embrace therebetween the integrated circuit, the inward bending of the outwardly angled DIP leads incident to inserting the same in their accomodating grooves of the conventional constructions of DIP carriers imposes pressures and stresses upon the delicate body of the DIP which tend to crack the same with resulting deleterious moisture penetration and other damage to the integrity of the encapsulated integrated circuit, especially during routine temperature and moisture cycling tests of the DIP units.

Referring again to FIGS. 1 to 6, it will be noted that the bottom edges of the opposite side walls 11—11 of the carrier 10 are connected by a pair of transversely extending bottom struts or beams 17—17 respectively located to underlie the opposite end portions of the DIP package for firmly supporting the same when it is inserted flatwise into the supporting carrier with its leads extending upwardly as shown in FIGS. 5 and 6. While in the illustrated carrier, the supporting struts are shown to be two in number disposed in parallel relation, any other suitable arrangement and disposition of such supporting struts may be employed so long as they adequately support the module body in the carrier in horizontally flat position. While not shown, the support could extend inward from opposite end walls.

Respectively formed upon the inside surfaces of the side walls 11—11 of the carrier, preferably but not necessarily in the regions occupied by the opposite end portions of the module are a pair of oppositely facing vertically extending grooves or channels 18—18 respectively adapted to receive therein registering leads of the module. In the carrier as shown, two such pairs of grooves are provided to receive and accomodate therein the two endmost pairs of the leads 16—16 of the DIP package, as best shown in FIGS. 5 and 6. It will be noted that the illustrated DIP package has a total of 14 leads, seven upon each side thereof and that except for the endmost opposed pairs of the DIP leads no grooves or channels are provided in the carrier for the remaining intermediate opposed pairs of said leads. The endmost pairs of the DIP leads, when inserted in their accomodating grooves, in themselves serve effectively to limit endwise shifting of the DIP package 14 when it is inserted into the carrier 10 to thereby insure that the DIP package is properly and accurately centered in the carrier.

However, if desired, one or more channels or grooves 18—18 may be provided at any suitable point or points along the inner side wall surfaces of the carrier structure for respective registry with predeterminedly selected leads of the module. Such grooves need not be in transverse opposition to one another but instead may be longitudinally offset since, as it will appear hereinafter, retention of the DIP package in the carrier does not depend upon any frictional engagement of its leads in the grooves or channels of the carrier. It will be apparent that one or more pairs of inwardly presenting grooves respectively formed in opposite side walls of the carrier to receive registering leads of the moduel are completely adequate and effective for preventing undesired horizontal shifting of the DIP package after it has been properly seated in the carrier.

Also, it will be understood that the present invention is not limited to a DIP module of fourteen leads as shown, since the number of the leads and their configuration may vary as desired depending upon the circuitry of the DIP package, it being only necessary that the carrier constructed in accordance with and embodying the principles of the present invention be of a size and shape to properly accomodate the DIP package for which it is designed.

Figures 1, 2, 3:
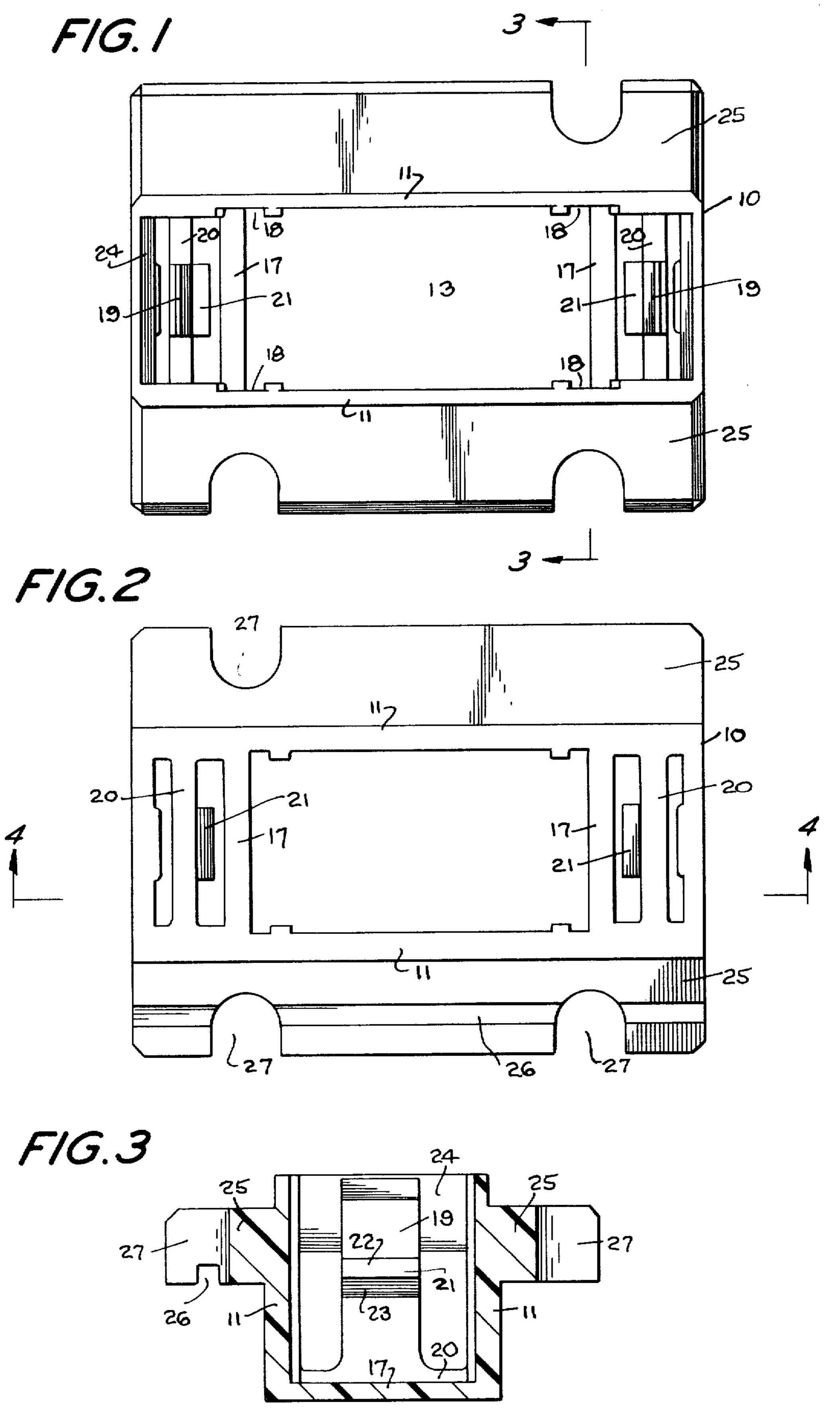
FIG. 1 is a top plan view plan of a dual-in-line integrated circuit carrier constructed in accordance with and embodying the principles of the present invention.
FIG. 2 is a bottom plan view thereof.
FIG. 3 is a transverse vertical sectional view of the carrier as taken along the line 3—3 of FIG. 1.

In addition to the bottom support struts 17—17 for the DIP package, the carrier 10 is provided at each end thereof in inwardly spaced relation to its opposite end walls 12—12 with a flexible retention member or arm 19 of the shape and form most clearly shown in FIGS. 1-3. Each of these retention members 19—19 is supported by and projects vertically upward from the central portion of a beam 20 which extends transversely across the bottom of the carrier 10 and interconnects the opposite side walls 11—11 thereof. The beams 20—20 are respectively located in slightly spaced outboard relation to the ends of the DIP package for which the carrier is designed and the flexible retention members extending upwardly from said beams are each provided intermediate its length with an inwardly presenting protuberance 21 having a downwardly inclined top cam surface 22 and reversely inclined bottom latching surface 23 which intersects the horizontal plane of the upper surface of the DIP body 15 when the latter is seated upon its support struts 17—17 of the carrier. The flexible retention members 19—19 are sufficiently resilient to permit outward deflection thereof through the pressure exerted upon their cam surfaces 22—22 by the opposite ends of the module body as the same is pressed downwardly into the carrier, with return of the retention members into their relaxed condition, as shown in FIGS. 4 and 6, being effected by their own inherent capacity of resisting such outward deflection. The retention members 19—19 may be supported otherwise than by the transverse beams 20—20, as, for example, by forming them as integral inwardly spaced extensions of the end walls 12—12 of the carrier structure.

It will be observed that in the relaxed vertically extending condition of the retention members 19—19, the protuberances 21—21 thereof each projects inwardly to an extent sufficient to overlie and engage the proximate upper edge of the DIP package seated in carrier 10. The downwardly inclined bottom surfaces 23—23 of the cam elements 21—21 provide for self-adjusting engagement thereof with the upper ends of the module body for accomodating and holding captive in the carrier modules having varying body thicknesses. Also, it will be noted that the retention members 19—19 each extend upwardly to a point approximately level with the top edge of the carrier 10 and that the proximate end walls 11—11 of the carrier are each tapered or feathered, as at 24, so as to permit the members 19—19 to be deflected outwardly sufficiently as best seen in FIG. 5, to permit downward movement of the DIP package 14 freely past the cam elements 21—21 into its seated position in the carrier.

The plastic material of which the carrier is formed provides the retention arms 19—19 with the requisite resilience to yieldingly swing from their relaxed vertically extending positions shown in FIG. 4 to their outwardly sprung positions shown in FIG. 5 under influence of the pressure exerted against them by the DIP package as it is downwardly inserted flatwise into the carrier and then return to their original condition to retain the DIP module in the carrier as shown in FIG. 6. This outward swing of the retention arms 19—19 may be effected automatically by the camming action of the ends of the DIP module against the upper cam surfaces 22—22 of the retention arm protuberances 21 or by manually deflecting the arms outwardly. Upon passage of the DIP module downwardly beyond the outer free edges of these cam surfaces 22—22, the retention arms 19—19 immediately swing inwardly and so render the bottom surfaces 23—23 of the protuberances 21 effective to hold the DIP module firmly in seated position upon the bottom support struts 17—17 of the carrier.

It will be apparent that in this operation of seating the DIP module in the carrier of the present invention, it is only necessary to properly register those leads 16 of the DIP with the carrier grooves or channels 18—18 provided therefor solely for the purpose of insuring rectilinear insertion and centering of the module in the carrier. Such insertion of the DIP module into the carrier may be effected manually or by suitable mechanical handling equipment such as is presently available for loading, feeding sorting, marking, testing and classification of DIP modules. Since the module is held in the carrier solely by the holding action of the resilient retention arms 19—19 engaging opposite ends of the body of the seated module and not by frictional retention of the DIP leads in grooves provided therefor in the carrier, there is no need for the leads to be angled or raked outwardly of the DIP body for its frictional retention in the carrier, thereby eliminating the imposition thereon of undesired destructive pressures and stresses which tend to deleteriously affect the DIP.

Removal of the DIP module from the carrier is readily effective, either manually or mechanically, by springing the retention arms 19—19 outwardly to thereby permit quick and easy release the module from its captured position in the carrier.

The carrier is provided upon opposite outer sides thereof with integrally formed outwardly projecting ribs or flanges 25—25 for use in handling the same, at least one of which may be provided with a polarization slot 26. Also, the flanges 25—25 may be provided with notches 27 as shown, which conjointly with the polarization slot, facilitate stacking and other manipulation and handling of the carriers manually or automatically by means of DIP package handling equipment well known in the art.

Figure 7:
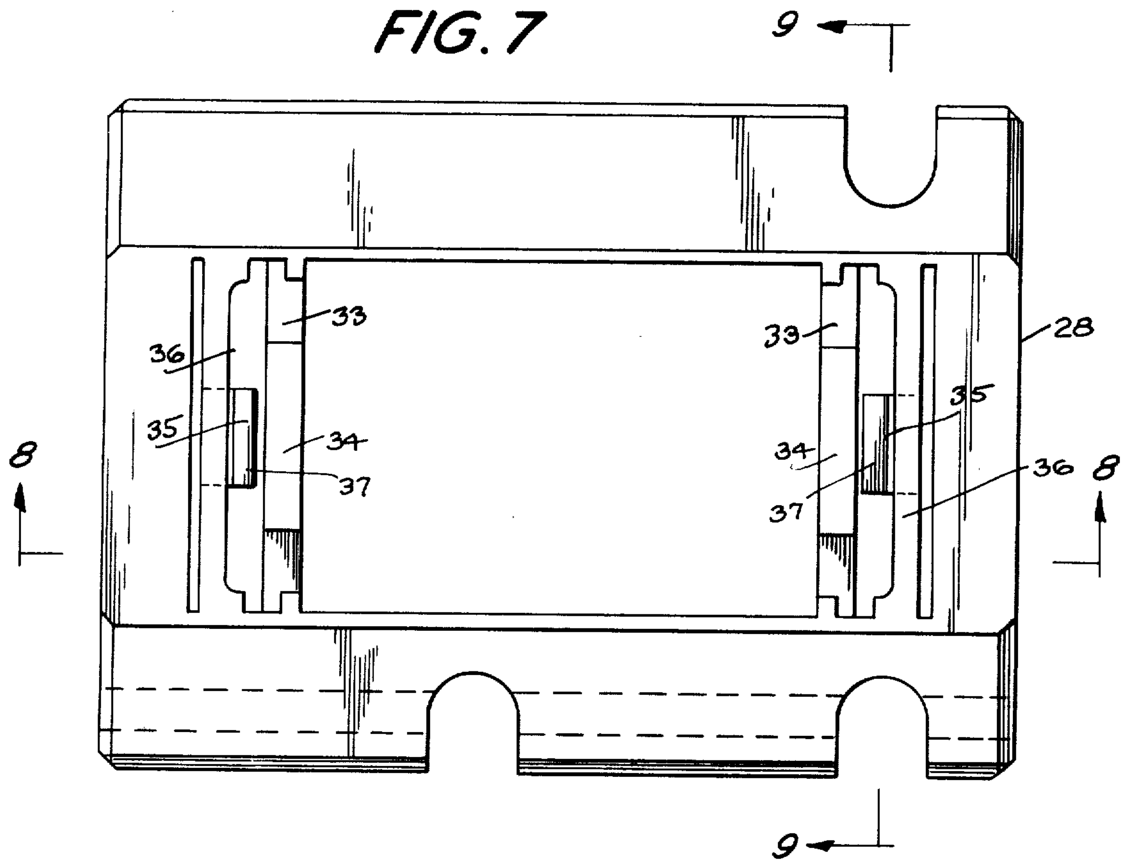
FIG. 7 is a top plan view of a modified form of the carrier.
Figure 8:
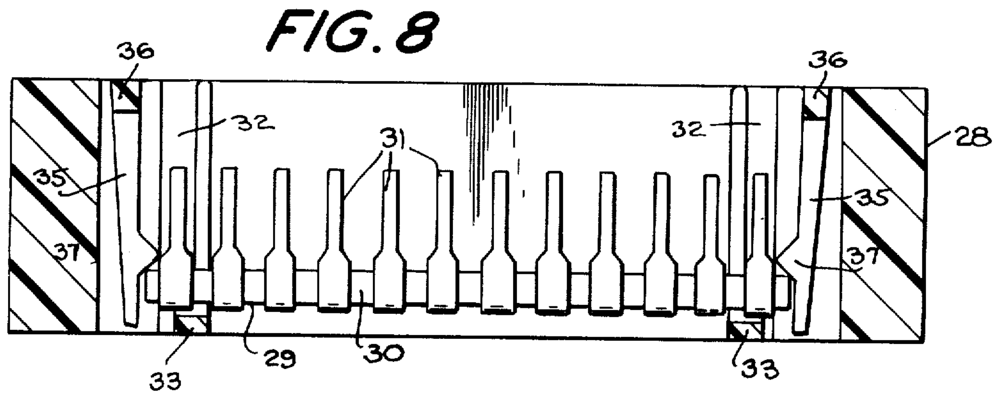
FIG. 8 is a longitudinal vertical sectional view of said modified form of the carrier as taken along the line 8—8 of FIG. 7.
Figure 9:
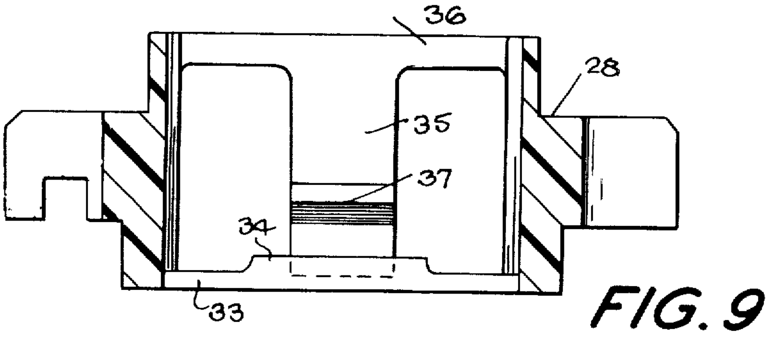
FIG. 9 is a transverse vertical sectional view of said modified form of the carrier as taken along the line 9—9 of FIG. 7.

FIGS. 7 to 9 illustrate a preferred modification of a carrier 28 designed to receive a DIP module 29 of the type having a relatively thin dielectric body 30 in which the integrated circuit is encapsulated. In this form of the DIP module the leads 31 from the circuit are of generally L-shaped form having their shorter leg portions inturned to overlie the margin of the bottom of the module (as viewed in FIG. 8) and their longer leg portions extending upwardly along the sides thereof. The module 29, like the module 14, is provided with two rows of such leads, one row upon each long side of the module, with the short legs of the leads of one row thereof transversely spaced from those of the opposite row.

As in the previously described form of the carrier, in the modified construction of FIGS. 7 to 9, the carrier 28 is interiorly provided at each end thereof with a pair of apposed grooves or channels 32—32 to receive the endmost pairs of apposed leads of the DIP module 29 and with a pair of longitudinally spaced transversely extending parallel bottom struts or beams 33—33 for flatwise support of the module inserted therein. In order to prevent engagement of the integrated circuit leads 31 with the supporting beams 33—33 and so maintain these leads free of any deleterious pressures or stresses, the beams 33—33 are each provided with a raised central portion or platform 34 upon which rests that portion of the body 30 of the DIP module 29 which extends between the horizontal inturned shorter leg portions of the leads.

In the modified construction of FIGS. 7 to 9, the anchorage of the flexible retention members 35—35 of the carrier are reversely arranged top for bottom as compared with those of the previously described construction, each of which members 35—35 depends centrally from a support beam 36 extending transversely across the open top of the carrier adjacent each wall thereof. The retention members 35—35 are each provided with an inwardly presenting protuberance 37 similar to that of the carrier previously described, but which, in this instance, is located closer to the free end of the retention member to provide a longer arm between the protuberance 37 and the support for the retention member and so reduce the degree of outward deflection of the retention member required for seating and/or removal of the DIP module 29 from its underlying support.

In all other material respects the carrier of FIGS. 7 to 9 is substantially similar in construction and in its mode of use to that of the previously described carrier shown in FIGS. 1 to 6, the members 35—35 having the capability of being resiliently deflected outwardly to permit flatwise insertion of the DIP module past the protuberance thereof and thence springing back inwardly to firmly hold the module captive in the carrier.

Since DIP packages are made in various standard sizes of length, width and depth, the arrangement and spacing of the lead grooves and of the retention members must be different for different sizes of the packages which are to be inserted in the carrier. However, all such carriers in respect to their essential dimensions are designed to have a tolerance range adequate to accept a given standard size DIP package as made by the major manufacturers thereof but which may vary dimensionally in thousandths of an inch.

It will be apparent that the carrier of the present invention permits easy insertion and removal of the DIP package into and out of the carrier while at the same time affording maximum protection to the integrated circuit leads during handling and testing of the package held in the carrier. Also, it will be understood that the present invention is susceptible of various changes and modifications which may be made from time to time without departing from the general principles or real spirit of the invention and that it is accordingly intended to claim the same broadly, as well as specifically, as indicated by the appended claims.

What is claimed as new and useful is:

1. A dual-in-line integrated circuit carrier adapted to receive therein an integrated circuit module of the dual-in-line type including a dielectric body member encapsulating the integrated circuit and two parallel rows of longitudinally spaced circuit leads respectively disposed in opposed relation along opposite sides of said body member and extending upwardly therefrom, said carrier comprising a box-like structure having side and end walls defining therebetween an open-topped cavity, said structure being provided at its bottom end with support means for the module disposed in underlying relation with respect to the module body to support the same upon its flatwise insertion into the carrier with its leads extending upwardly, at least one pair of internal vertically extending grooves or channels respectively formed in the opposite side walls of the cavity in registering alinement with predeterminedly selected leads of the module for receiving said leads to limit end-wise shift of the module in the carrier, and means resiliently engageable with opposite ends of the module body to releasably hold the same captive in the carrier.

2. A carrier as defined in claim 1 wherein said box-like structure is of generally rectangular shape having oppositely disposed parallel side walls and oppositely disposed parallel end walls and wherein the portion of said support means which supportively engages the module body is disposed in inwardly spaced relation to the opposite end walls of the structure, whereby to underlie and support opposite end portions of the module body.

3. A carrier as defined in claim 2 wherein said support means includes a pair of members extending transversely between said side walls which members are respectively disposed in said inwardly spaced relation to the opposite end walls of the structure and are spaced apart a distance less than the overall length of the module whereby the opposite end portions of the module body may freely overhang the outermost extremities of said support means.

4. A carrier as defined in claim 1 wherein said opposite side walls of the module-receiving cavity are internally provided adjacent opposite end portions thereof with vertically extending inwardly presenting individual grooves or channels for receiving therein only the endmost pairs of opposed leads of the integrated module, the intermediate portions of said side walls being free of any individual lead-receiving grooves or channels.

5. A carrier as defined in claim 1 wherein said resilient holding means for the module includes at each end of the carrier structure, outboard of each end of the module body inserted in the carrier, a freely extending vertically disposed flexible member having an inwardly presenting protuberance adapted to overlie an end of the module body to releasably hold the module captive in the carrier.

6. A carrier as defined in claim 5 wherein each said flexible member is disposed centrally between and in spaced relation to the opposite side walls of the carrier structure.

7. A carrier as defined in claim 5 wherein each of said flexible members is centrally supported upon a substantially rigid beam extending transversely between the opposite side walls of the carrier structure.

8. A carrier as defined in claim 5 wherein said protuberances are each provided with an inwardly presenting downwardly inclined cam surface which acts upon engagement therewith by an end of the module body to cam said member outwardly of the engaging end of the module for insertion of the module into the carrier.

9. A carrier as defined in claim 8 wherein said camming protuberance is provided with a reversely inclined bottom edge adapted upon inward return movement of the outwardly cammed flexible member to ride over upon and engage the top edge of the module body to releasably hold the module in said carrier.

10. A carrier as defined in claim 5 wherein said freely extending flexible members have their fixed ends disposed substantially in the horizontal plane of the support means for the body of the integrated circuit module and their said inwardly presenting protuberances disposed at elevated points for engagement thereof with the uppermost end edges of the module body to hold the latter seated upon its underlying support means.

11. A carrier as defined in claim 5 wherein said freely extending flexible members have their fixed ends disposed substantially in a horizontal plane spaced well above the upper surface of the module body when the latter is seated upon its underlying support means and their said inwardly presenting protuberances disposed therebelow at elevated points with respect to the module body for holding engagement thereof with the uppermost end edges of the module body.

12. A carrier as defined in claim 9 wherein said cam surfaces are respectively engaged by the bottom edges of the module body to cam the flexible members outwardly of said module body as it is pressed flatwise into the carrier for seating engagement upon its underlying support means and wherein upon inward return swing of the flexible members under influence of their inherent resiliency said bottom edges of the cam protuberances engage and hold the module body in seated position upon said support means.

13. A carrier as defined in claim 1 wherein said support means for the integrated circuit module is provided with means engageable solely by the longitudinally extending central portion of the module body whereby to preclude direct engagement of the module leads with said support means.

14. A carrier as defined in claim 3 wherein said support members for the integrated circuit module are each provided intermediate its opposite ends with a raised central section constituting a supporting platform which is engageable solely by the longitudinally extending central portion of the module body with the leads of the latter free from any engagement with said support means.

* * * * *